(12) United States Patent
Cappelletti et al.

(10) Patent No.: US 12,356,634 B2
(45) Date of Patent: Jul. 8, 2025

(54) PHASE CHANGE MEMORY

(71) Applicants: STMicroelectronics S.r.l., Agrate Brianza (IT); STMicroelectronics (Crolles 2) SAS, Crolles (FR)

(72) Inventors: Paolo Giuseppe Cappelletti, Seveso (IT); Fausto Piazza, Grenoble (FR); Andrea Redaelli, Milan (IT)

(73) Assignees: STMicroelectronics S.r.l., Agrate Brianza (IT); STMicroelectronics (Crolles 2) SAS, Crolles (FR)

( * ) Notice: Subject to any disclaimer, the term of this patent is extended or adjusted under 35 U.S.C. 154(b) by 489 days.

(21) Appl. No.: 17/874,595

(22) Filed: Jul. 27, 2022

(65) Prior Publication Data
US 2023/0032898 A1 Feb. 2, 2023

(30) Foreign Application Priority Data
Jul. 30, 2021 (FR) .................................. 2108320

(51) Int. Cl.
*H10B 63/00* (2023.01)
*H10N 70/00* (2023.01)
*H10N 70/20* (2023.01)

(52) U.S. Cl.
CPC .......... *H10B 63/80* (2023.02); *H10B 63/30* (2023.02); *H10N 70/011* (2023.02); *H10N 70/231* (2023.02)

(58) Field of Classification Search
CPC ...... H10B 63/30; H10B 63/80; H10N 70/011; H10N 70/231; H10N 70/8825; H10N 70/8828
See application file for complete search history.

(56) References Cited

U.S. PATENT DOCUMENTS

| | | | |
|---|---|---|---|
| 2005/0127347 A1* | 6/2005 | Choi ...................... | H10B 63/30 438/622 |
| 2005/0263823 A1* | 12/2005 | Hwang ............... | H01L 29/7843 257/536 |
| 2006/0110878 A1* | 5/2006 | Lung ...................... | H10B 63/80 438/704 |
| 2008/0048213 A1 | 2/2008 | Liu | |

(Continued)

OTHER PUBLICATIONS

INPI Search Report and Written Opinion for priority application, FR 2108320, report dated Jul. 18, 2022, 8 pgs.

(Continued)

*Primary Examiner* — Brook Kebede
(74) *Attorney, Agent, or Firm* — Crowe & Dunlevy LLC (57) ABSTRACT

A memory cell includes a substrate with a semiconductor region and an insulating region. A first insulating layer extends over the substrate. A phase change material layer rests on the first insulating layer. The memory cell further includes an interconnection network with a conductive track. A first end of a first conductive via extending through the first insulating layer is in contact with the phase change material layer and a second end of the first conductive via is in contact with the semiconductor region. A first end of a second conductive via extending through the first insulating layer is in contact with both the phase change material layer and the conductive track, and a second end of the second conductive via is in contact only with the insulating region.

21 Claims, 5 Drawing Sheets

(56) References Cited

U.S. PATENT DOCUMENTS

2009/0032796 A1    2/2009  Lung
2017/0092694 A1*  3/2017  BrightSky .......... G11C 13/0069

OTHER PUBLICATIONS

Merget F et al: "Lateral Phase Change Random Access Memory Cell Design for Low Power Operation" Mycrosystem Technologies; Micro and Nanosystems Information Storage and Processing Systems, Springer, Berlin vol. 13, Apr. 5, 2006—XP019461439.
8-bit Precision In-Memory Multiplication with Projected Phase-Change Memory I. Giannopoulos, A. Sebastian, M. Le Gallo, V.P. Jonnalagadda, M. Sousa, M.N. Boon, and E. Eleftheriou IEDM2018, 27.7.1.
Optimization Metrics for Phase Change Memory (PCM) Cell Architectures M. Boniardi, A. Redaelli, C. Cupeta, F. Pellizzer, L. Crespi, G. D'Arrigo, A. L. Lacaita and G. Servalli IEDM2014, 29.1.1, 2014 IEEE.

* cited by examiner

PHASE CHANGE MEMORY

PRIORITY CLAIM

This application claims the priority benefit of French Application for Patent No. 2108320, filed on Jul. 30, 2021, the content of which is hereby incorporated by reference in its entirety to the maximum extent allowable by law.

TECHNICAL FIELD

The present disclosure relates generally to memory devices and, more specifically, to phase-change memory cells.

BACKGROUND

Phase-change materials are materials which can switch, under the effect of heat, between a crystalline phase and an amorphous phase. Since the electrical resistance of an amorphous material is significantly greater than the electrical resistance of a crystalline phase of the same material, such a phenomenon is used to define two memory states, for example, logic 0 and logic 1, differentiated by the resistance measured through the phase-change material. The most common phase-change materials used for manufacturing memories are alloys made up of germanium, of antimony, and of tellurium.

There is a need in the art to address all or some of the drawbacks of known phase change memories.

SUMMARY

One embodiment provides a memory cell comprising: a substrate comprising a semiconductor region and an insulating region; a first insulating layer and a second layer of phase change material resting on the first insulating layer, the first insulating layer being crossed by first and second conductive vias, the first conductive via being in contact, by one end, with the first layer and, by another end, with the semiconductor region, the second conductive via being in contact, by one end, with the first layer and a conductive track of an interconnection network covering the first layer and, by another end, only with the insulating region.

Another embodiment provides a method of manufacturing a memory cell comprising: a) forming a substrate comprising a semiconductor region and an insulating region; b) forming a first insulating layer crossed by first and second conductive vias; and c) forming a second layer of phase change material resting on the first insulating layer, the first conductive via being in contact, by one end, with the first layer and, by another end, with the semiconductor region, the second conductive via being in contact, by one end, with the first layer and a conductive track of an interconnection network covering the first layer and, by another end, only with the insulating region.

According to an embodiment, the semiconductor region is a source or a drain region of a transistor.

According to an embodiment, the second layer is covered by a third insulating layer.

According to an embodiment, the height of the second layer is lower than the height of the conductive track.

According to an embodiment, the conductive track and the second layer are separated by a portion of insulating material.

According to an embodiment, the second layer is at least partially in a crystalline state.

According to an embodiment, the method comprises a step d), following step c), of formation of the interconnection network over the second layer.

According to an embodiment, the method comprises a step c1), between step c) and d), of formation of a protection layer over the second layer.

According to an embodiment, the method comprises, before step d), the etching of the protection layer in order to form spacers on the flanks of the second layer.

Another embodiment provides a memory array comprising a plurality of memory cells as described previously.

According to an embodiment, the memory array comprises at least one cell with a second layer partially in an amorphous state.

BRIEF DESCRIPTION OF THE DRAWINGS

One or more embodiments will now be described, by way of example only, with reference to the annexed figures, wherein.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
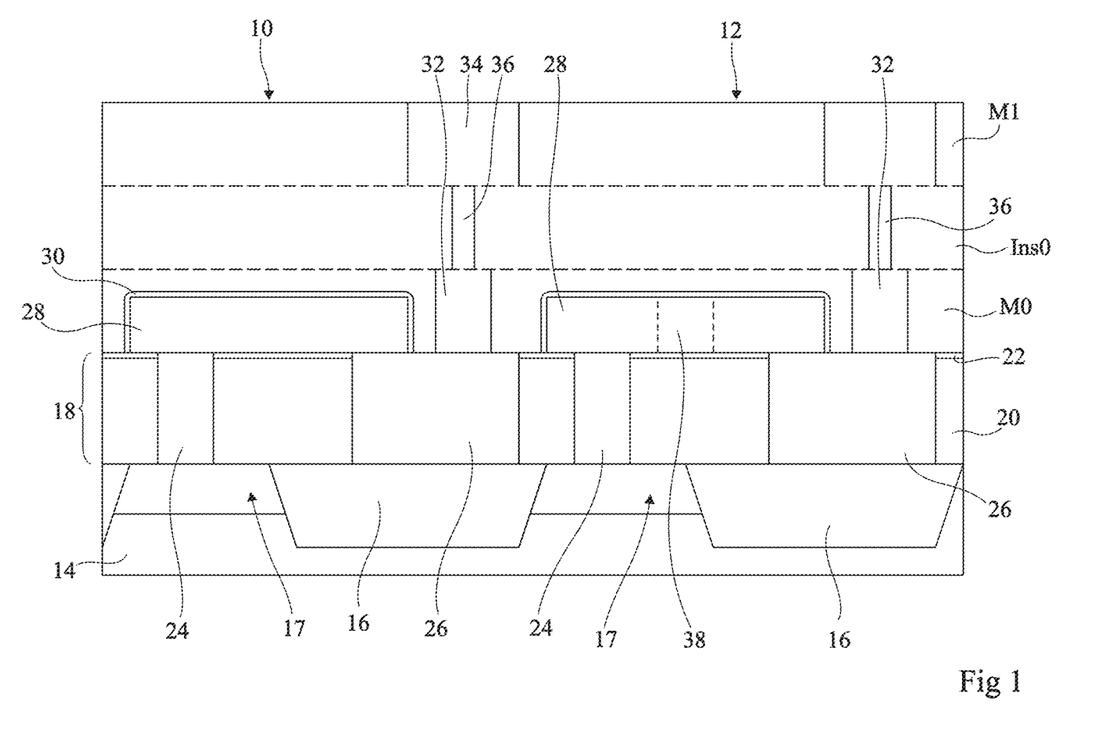
FIG. 1 illustrates two phase change memory cells according to an embodiment.

FIG. 1 illustrates two phase change memory cells 10 and 12 according to an embodiment. FIG. 1 is in a cross-section taken along lines AA of the plan (layout) view shown in FIG. 2. The cells 10 and 12 are part of a memory array comprising a plurality of cells 10, 12, disposed in lines and columns to form wordlines and bitlines.

The memory cells 10 and 12 are formed on a substrate 14. The substrate 14 is made of a semiconductor material, for example in silicon. Insulating regions 16 are formed in the substrate 14. The insulating regions 16 are made of an insulating material, for example in silicon oxide or in silicon nitride, and comprise in an example shallow trench isolation (STI) structures. Each cell 10, 12 is located in regard of a region 16 and of a region 17 of the substrate approximatively on the same level as the regions 16. In other words, the upper face of the regions 16 and 17 are approximatively on the same level.

The regions 17 are for example doped. For example, the regions 17 correspond to source or drain, preferably drain, regions of transistors.

The substrate 14, and the regions 16, are covered by an insulating layer 18. The layer 18 can be a single layer of a single insulating material or a stack of more than one layer of insulating material. In the example of FIG. 1, the stack 18 comprises a first layer 20, for example in silicon oxide, covered by a second layer 22 of the stack, for example in silicon nitride. The stack 18 may, for example, form a pre-metallization dielectric (PMD) region.

Each cell 10, 12 comprises a first conductive contact, or via, 24. Each contact 24 crosses the stack 18. Each contact 24 extends from one of the regions 17, and is in contact, by a first extremity thereof (i.e., an end), with said region 17. Each contact 24 extends from the region 17 to the upper face of the stack 18.

Each cell 10, 12 comprises a second conductive contact, or via, 26. Each contact 26 crosses the stack 18. Each contact 26 extends from one of the regions 16, and is in contact, by a first extremity thereof (i.e., an end), with said region 16. Preferably, the lower face of the contact 26, in other words the face in contact with the region 16, is solely in contact with the region 16. The contacts 26 are not in contact with the substrate 14, and in particular are not in contact with the regions 17. Each contact 26 extends from the region 16 to the upper face of the stack 18. The contact 26 is separated from the contact 24 by a portion of the stack 18.

Each cell 10, 12 comprises a layer, or portion, 28 made of a crystalline phase change material, for example in an alloy of germanium, tellurium and antimony.

The layer 28 of each cell covers at least partially the contact 24. Therefore, the contact 24 is at least partially in contact, by a second extremity thereof (i.e., an end), with the layer 28. One side of the layer 28 is therefore electrically coupled with the substrate by the contact 24. The layer 28 of each cell also covers partially the contact 26. Therefore, the contact 26 is partially in contact, by a second extremity thereof (i.e., an end), with the layer 28. A part of the second extremity of the contact 26, in other words the upper face of the contact 26, is not covered by the layer 28. The contact 26 is not in contact with the substrate 14.

The layer 28 of each cell is preferably covered by a protection layer 30, for example made of an insulating material, for example in silicon nitride. Preferably, the layer 30 covers the upper face of the layer 28 and the lateral faces of the layer 28.

The structure previously described is covered by an interconnection network. The interconnection network comprises a stack of insulating layers, each layer comprising either conductive tracks or conductive vias. The interconnection network comprises an insulating layer M0, covering the layer 30, and therefore the layer 28. The layer M0 preferably also covers the part of the contact 26 and the stack 18 that are not covered by the layer 28. Conductive tracks 32 are located in the insulating layer M0. The conductive tracks 32 cross the layer M0. In other words, the conductive tracks 32 extend from the lower face of the layer M0, in other words the face the closest to the contact 26, to the upper face of the layer M0.

Each contact 26 is connected, by the second extremity, with a conductive track 32. In other words, a conductive track 32 is in contact with each contact 26, more precisely with the part of the contact 26 not covered by the layer 28. The conductive track 32 is not in contact with the layer 28. Therefore, the conductive track 32 is separated from the layer 28 by the layer 30 and a portion of the layer M0.

The interconnection network further comprises an insulating layer M1, comprising conductive tracks 34, the layer M1 being separated from the layer M0 by a layer I0, comprising conductive vias 36. In other words, the layer I0 covers the layer M0 and the layer M1 covers the layer I0. The tracks 34 are coupled to tracks 32 by the vias 36.

The height (or thickness) of the layer 28 is lower than the height (or thickness) of the layer M0. Preferably, the combined heights (thicknesses) of the layers 28 and 30 is lower than the height (thickness) of the layer M0. Thus, a portion of the layer M0 extends over both the layers 28 and 30.

Each cell is programmed by applying a programming current between the region 17 and the conductive track 32. In other words, an electrical current flows through the region 17, the contact 24, the layer 28, the contact 26 and the conductive track 32. The current applied is sufficient to heat the layer 28 and create an amorphous region 38 in the layer 28.

Cell 10 of FIG. 1 does not comprise the region 38 and cell 12 comprises the region 38. The impedances of the cells are different enough that such difference can be measured. Therefore, cell 10 corresponds to a stored data corresponding to a first binary number, for example 'logic 0', and cell 12 corresponds to a stored data corresponding to a second binary number, for example 'logic 1'.

Figure 2:
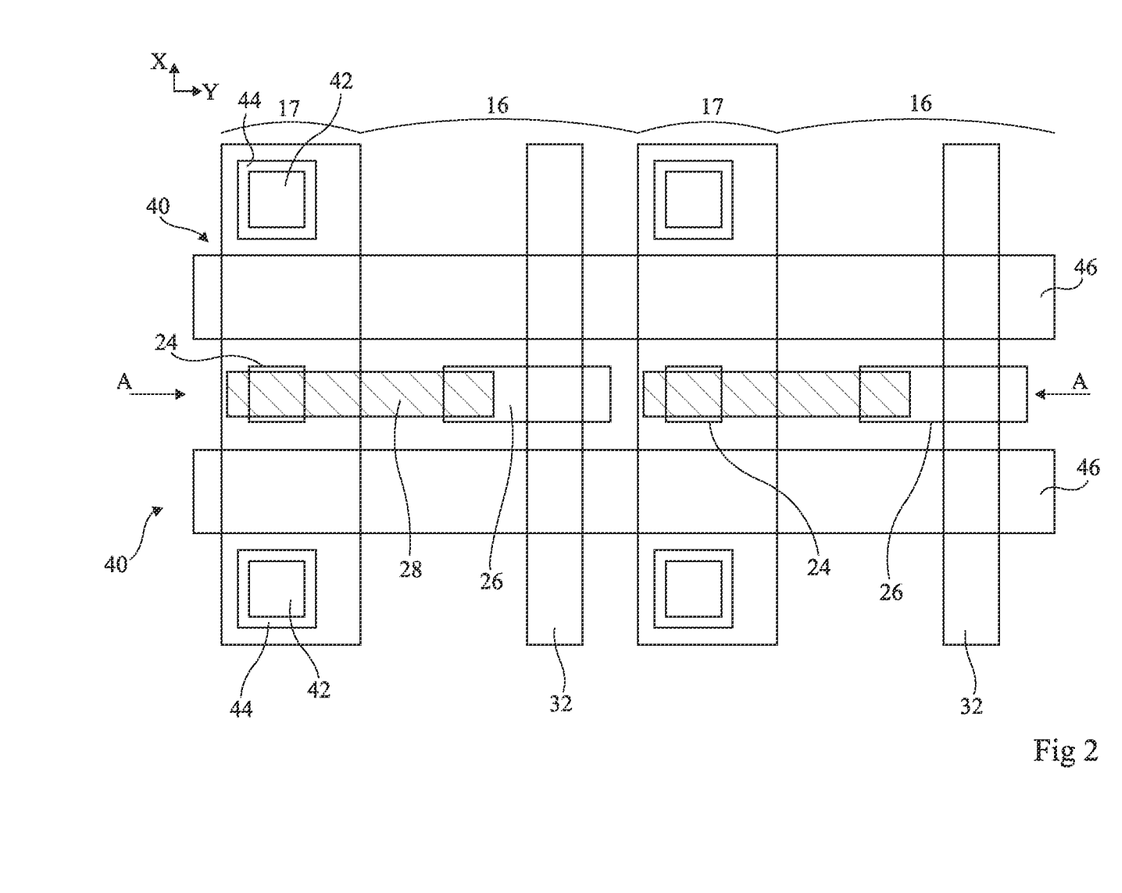
FIG. 2 illustrates, schematically, the placement of the different parts of the embodiment of FIG. 1.

FIG. 2 illustrates, schematically, the placement of the different parts of the embodiment of FIG. 1. FIG. 2 is a view from above of the cells 10, 12 of FIG. 1 located in a memory array, however, the different elements represented are not all in the same plane.

FIG. 2 illustrates an alternating of strips of regions 17 and 16, in the substrate. The strips extend in a direction X in the plan view of FIG. 2, corresponding for example to the direction of a bitline of the memory array.

A contact 24 is situated on each strip 17 for each cell. A contact 26 is situated on each strip 16 for each cell. A layer 28 is located on the contacts 24 and 26 of each cell, as described in relation with FIG. 1. The layer 28 extends in a direction Y in the plan view of FIG. 2, perpendicular to the direction X. The direction Y corresponds for example to a wordline of the memory array.

The tracks 32 extend in the direction X and are in contact with several cells, preferably all the cells of a same bitline.

The memory array further comprises selection elements 40, preferably transistors, formed in the regions 17. Each transistor 40 comprises drain and source regions, one of which, for example the drain, is located in one of the regions 17 under, and in contact with, the contact 24 and the other is located in the same region 17. For example, as in the example of FIG. 2, the portion of the region 17 under each contact 24 constitutes a drain (or source) region for two transistors, the source (or drain) region of each of the two transistors being in the region 17, preferably on opposed side of the contact 24 in the direction X.

Conductive vias 42, for example identical to the contact 24, cross the insulating layer 18. One of the vias 42 is in contact with each source (or drain) region of the transistors 40 that are not in contact with contact 24. A conductive track 44 located in the layer M0 is in contact with each via 42. Preferably, the tracks 44 of the source (or drain) regions of a same wordline, in other words the tracks 44 aligned in the direction Y, are coupled together, for example by conductive tracks.

The gates of the transistors are, for example, common to the transistors of a same wordline, in other words the transistors 40 aligned in the direction Y. The gates are represented by strips 46, extending in the direction Y.

In order to program one of the cells, the programming current flows from a track 44, a via 42, and the region 17 (through transistor 40) to reach the contact 24.

FIGS. 3 to 7 illustrates steps, preferably successive steps, of a method of manufacturing the embodiment of FIG. 1. FIGS. 3 to 7 are cross-sectional views along the line AA in the plan view of FIG. 2 representing a single memory cell, for example cell 10.

Figure 3:
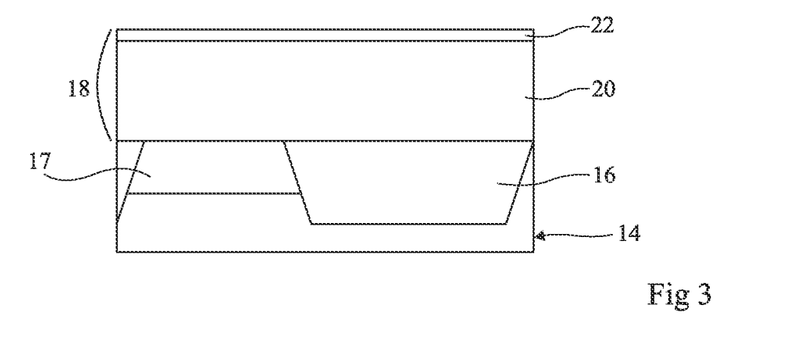
FIG. 3 illustrates a step of an embodiment of a method of manufacturing the embodiment of FIG. 1.

FIG. 3 illustrates a step of an embodiment of a method of manufacturing the embodiment of FIG. 1.

This step comprises the formation, in the substrate 14, of the insulating regions 16 and the regions 17. The formation of the regions 16 for example comprises the formation of cavities in the substrate 14 and the filling of said cavities with insulating material.

This step further comprises the formation of the selection elements, for example the transistors 40, in and on the substrate, more precisely, in and on the regions 17. The formation of the transistors 40, for example, comprises the doping of the regions 17, in order to form the drain and source regions, and the formation of the gate on the substrate. This is not specifically shown in FIG. 3, but the structures are shown in FIG. 2.

This step comprises the deposition of the layer, or stack of layers 18, over the substrate 14 and the regions 16. More precisely, in the example of FIG. 3, this step comprises the deposition of layer 20 over the substrate and the regions 16, and in particular over the regions 16 and 17, and the deposition of layer 22 over layer 20. Preferably, layer, or stack of layers, 18 is deposed over the entire structure.

Figure 4:
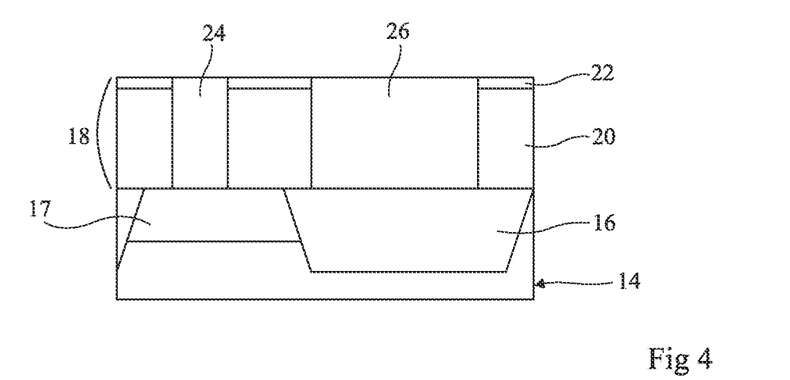
FIG. 4 illustrates another step of an embodiment of a method of manufacturing the embodiment of FIG. 1.

FIG. 4 illustrates another step of an embodiment of a method of manufacturing the embodiment of FIG. 1.

This step comprises the formation of the contacts 24 and 26. The formation of the contacts 24 and 26 comprises, for example, the formation of cavities in the stack 18 and the filling of these cavities with a conductive material, for example a metal. The cavities go through the stack 18 in order to access the regions 17 (in the case of the cavities corresponding to contacts 24) and access the regions 16 (in the case of the cavities corresponding to contacts 26).

Figure 5:
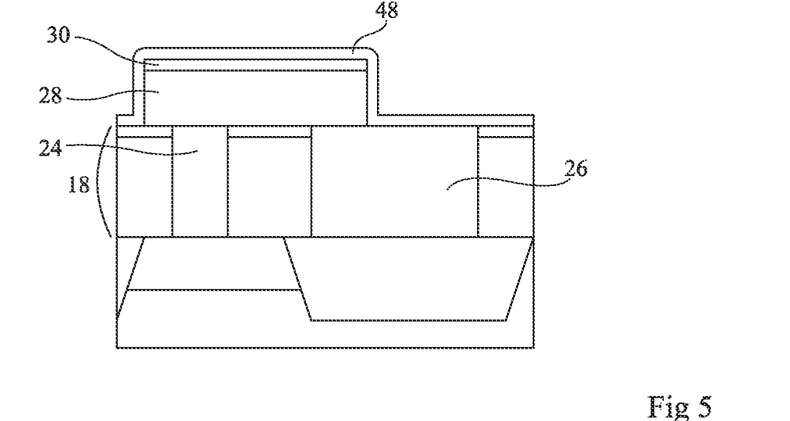
FIG. 5 illustrates another step of an embodiment of a method of manufacturing the embodiment of FIG. 1.

FIG. 5 illustrates another step of an embodiment of a method of manufacturing the embodiment of FIG. 1.

This step comprises the formation of the layer 28 and the layer 30 over the contacts 24 and 26 and over the stack 18. In other words, the layer 28 covers the contacts 24 and 26 and the stack 18 and the layer 30 covers the layer 28. Preferably, the layers 28 and 30 cover, when deposed, the entire structure formed at the step illustrated by FIG. 4.

The layers 28 and 30 are etched in order to obtain the layers 28 and 30 described in relation with FIG. 1. In other words, the layers 28 and 30 are etched in order to formed strips extending from a contact 24 to a contact 26, covering at least partially the contact 24 and partially the contact 26. Each stack of layers 28, 30, after being etched, covers only one contact 24 and partially covers only one contact 26. See, FIG. 2.

This step also comprises the formation of a protection layer 48. The layer 48 is preferably in an insulating material, for example in the same material as the layer 30, for example in silicon nitride. Layer 48 covers preferably the entire structure resulting of the etching step described in relation with FIG. 5. More precisely, layer 48 is conformably formed on the upper face of the layer 30, on the flanks of the layers 28 and 30, on the contacts 26 and on the stack 18.

Figure 6:
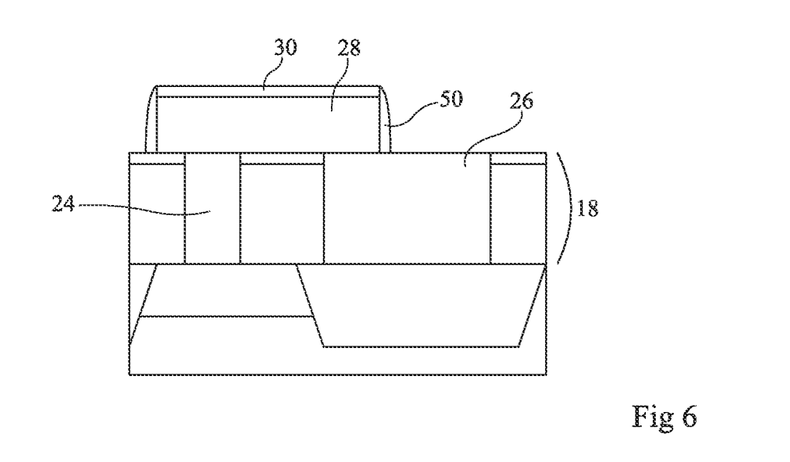
FIG. 6 illustrates another step of an embodiment of a method of manufacturing the embodiment of FIG. 1.

FIG. 6 illustrates another step of an embodiment of a method of manufacturing the embodiment of FIG. 1.

This step corresponds to the formation of spacers 50 on the flanks of the layers 28 and 30. More precisely, layer 48 is etched by an anisotropic etch. The portions of layer 48 located on the upper face of layer 30 and on the upper face of contacts 26 and of stack 18 are removed. In other words, all of the layer 48 except the portion on the flanks of the layer 28 and 30 are preferably etched.

Figure 7:
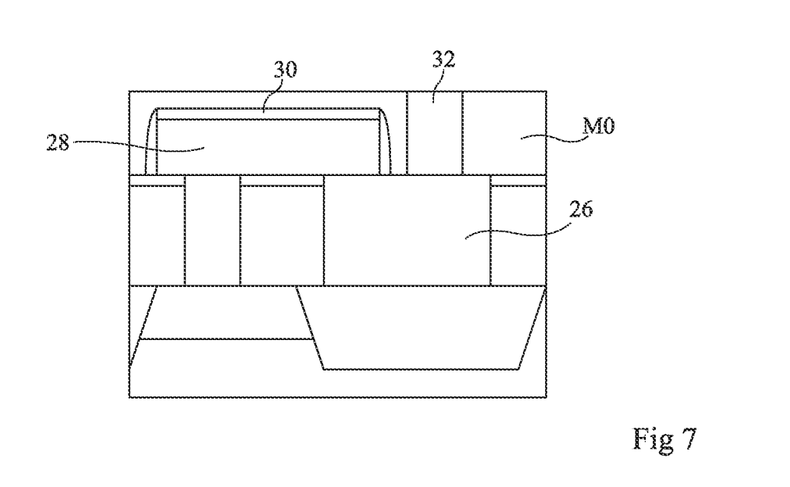
FIG. 7 illustrates another step of an embodiment of a method of manufacturing the embodiment of FIG. 1.

FIG. 7 illustrates another step of an embodiment of a method of manufacturing the embodiment of FIG. 1.

This step comprises the formation of the interconnection network. FIG. 7 only illustrates the formation of the first level M0. Other levels, in other words other layers, of the interconnection network are formed over layer M0 but are not represented in FIG. 7.

The step illustrated by FIG. 7 comprises the formation of the insulating layer M0 over the structure resulting from the step of FIG. 6 and the formation of the conductive tracks 32 in the layer M0.

Layer M0 is configured to cover entirely layers 28 and 30 and present a planar upper surface. Therefore, the formation of the layers of the interconnection level above layer M0 is not impacted by the presence of the memory cells.

Figure 8:
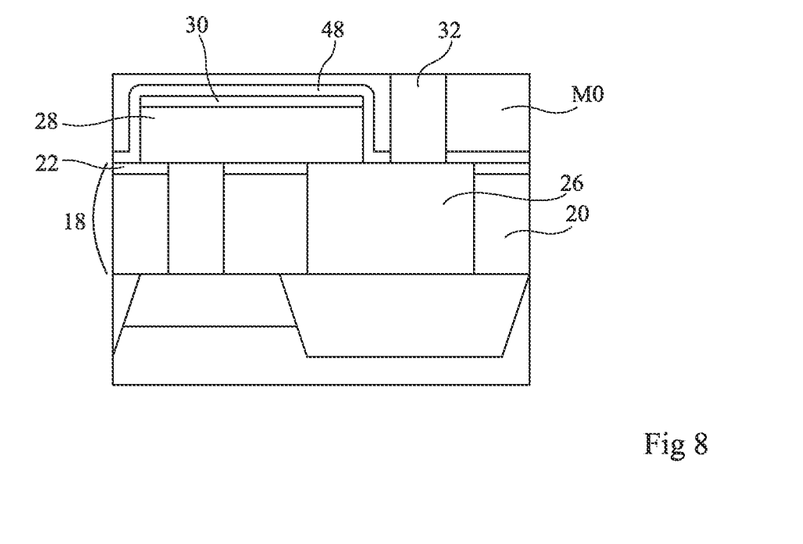
FIG. 8 illustrates another embodiment of a phase change memory.

FIG. 8 illustrates another embodiment of a phase change memory.

The embodiment of FIG. 8 differs from the embodiment of FIG. 1 in that insulating layer M0 is separated from the stack comprising the layers 28 and 30, from the contact 26 and from the stack 18 by the protection layer 48. The conductive tracks 32 therefore extend through the layer M0 and the layer 48 in order to be in contact with the contact 26.

The method of manufacturing the embodiment of FIG. 8 differs from the method described in relation with FIGS. 4 to 7 in that it does not comprise the step of FIG. 6. In other words, the layer 48 is not etched in order to form the spacers 50. The step of FIG. 7 differs in that the layer M0 covers the layer 48 and that the formation of the conductive tracks 32 comprises the etching of the layer M0 and the layer 48 at the location of the tracks 32.

As an alternative, a resistive element, for example having a L-form, could be formed between the contact 24 and the layer 28. Furthermore, as an alternative, a conductive layer covering the layer 28 and a via from the layer I0 could be used for connecting the cell to the interconnection network. While such a structure would permit to manufacture a memory array having a greater density and consuming less power for each programming, the manufacturing process would need many more steps, and in particular several additional etching masks, which are costly. In some applications, the memory array corresponds to a very small part of a circuit, and is rarely used. For example, in such application, the memory array can be programmed once and never, or rarely, modified afterward. In such application, a great density and a low consumption for the programming are not worth the corresponding cost of manufacturing.

An advantage of the described embodiment is that only the layers 28 and 30 are situated in the layer M0. The combined height (thickness) of the layers 28 and 30 can be made lower than the height (thickness) of the layer M0. Therefore, the presence of the cells 10, 12 advantageously does not modify the structure and the manufacturing of the interconnection network.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

The invention claimed is:

1. A memory cell, comprising:
   a substrate including a semiconductor region and an insulating region;
   a first insulating layer over the substrate;
   first and second conductive vias crossing the first insulating layer;
   a phase change material layer resting on the first insulating layer; and
   an interconnection network covering the phase change material layer and first insulating layer and including a conductive track;
   wherein a first end of the first conductive via is in contact with the phase change material layer and a second end of the first conductive via is in contact with the semiconductor region; and
   wherein a first end of the second conductive via is in contact with both the phase change material layer and the conductive track, and wherein a second end of the second conductive via is in contact only with the insulating region.

2. The memory cell according to claim 1, wherein the semiconductor region is a source or drain region of a transistor.

3. The memory cell according to claim 1, wherein the interconnection network includes a second insulating layer and wherein the conductive track crosses the second insulating layer.

4. The memory cell according to claim 3, wherein a thickness of the second insulating layer is greater than a thickness of the phase change material layer.

5. The memory cell according to claim 1, wherein a thickness of the phase change material layer is less than a thickness of the conductive track.

6. The memory cell according to claim 1, wherein the conductive track and the phase change material layer are separated by a portion of insulating material.

7. The memory cell according to claim 1, wherein the phase change material layer is at least partially in a crystalline state.

8. A memory array, comprising: a plurality of memory cells, wherein each memory cell comprises the memory cell according to claim 1.

9. The memory array according to claim 8, wherein at least one memory cell of said plurality of memory cells has the phase change material layer partially in an amorphous state.

10. A method of manufacturing a memory cell, comprising the steps of:
   a) forming a semiconductor region and an insulating region in a substrate;
   b) forming a first insulating layer over the substrate;
   c) forming first and second conductive vias crossing the first insulating layer;
   d) forming a phase change material layer resting on the first insulating layer; and
   e) forming an interconnection network covering the phase change material layer and first insulating layer and including a conductive track;
   wherein a first end of the first conductive via is in contact with the phase change material layer and a second end of the first conductive via is in contact with the semiconductor region; and
   wherein a first end of the second conductive via is in contact with both the phase change material layer and the conductive track, and wherein a second end of the second conductive via is in contact only with the insulating region.

11. The method according to claim 10, wherein the semiconductor region is a source or drain region of a transistor.

12. The method according to claim 10, further comprising covering the phase change material layer with a second insulating layer, wherein a thickness of the phase change material layer is less than a thickness of the conductive track.

13. The method according to claim 10, further comprising laterally separating the conductive track from the phase change material layer by a portion of insulating material.

14. The method according to claim 10, wherein the phase change material layer is at least partially in a crystalline state.

15. The method according to claim 10, wherein step d) further comprises forming a protection layer over the phase change material layer.

16. The method according to claim 15, comprising, before step e), etching the protection layer to form spacers on flanks of the phase change material layer.

17. A memory cell, comprising:
   a semiconductor substrate including a doped semiconductor region and an insulating region;
   a first insulating layer over the semiconductor substrate;
   a second insulating layer resting on the first insulating layer, wherein said second insulating layer includes:
      a region of phase change material; and
      a conductive track;
   a first conductive via passing through the first insulating layer and electrically connecting the region of phase change material to the doped semiconductor region;
   a second conductive via crossing the first insulating layer and resting on the insulating region;
   wherein said second conductive via electrically connects the region of phase change material to the conductive track.

18. The memory cell according to claim 17, wherein a thickness of the region of phase change material is less than a thickness of the conductive track and less than a thickness of the second insulating layer.

19. The memory cell according to claim 17, wherein a portion of the second insulating layer laterally separates the conductive track from the region of phase change material.

20. A memory array, comprising: a plurality of memory cells, wherein each memory cell comprises the memory cell according to claim 17.

21. The memory array according to claim 20, wherein at least one memory cell of said plurality of memory cells has the phase change material layer partially in an amorphous state.

* * * * *